(12) United States Patent
Smith et al.

(10) Patent No.: US 7,027,318 B2
(45) Date of Patent: Apr. 11, 2006

(54) METHOD AND SYSTEM FOR ADJUSTING OFFSET VOLTAGE

(75) Inventors: Kenneth K. Smith, Boise, ID (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 146 days.

(21) Appl. No.: 10/449,572

(22) Filed: May 30, 2003

(65) Prior Publication Data

US 2004/0240256 A1 Dec. 2, 2004

(51) Int. Cl.
*G11C 11/00* (2006.01)

(52) U.S. Cl. .................... 365/158; 365/189.07
(58) Field of Classification Search ........... 365/158, 365/189.07
See application file for complete search history.

(56) References Cited

U.S. PATENT DOCUMENTS

| | | | | |
|---|---|---|---|---|
| 3,947,778 A * | 3/1976 | Hsiao et al. | ............... | 330/253 |
| 4,104,725 A * | 8/1978 | Rose et al. | .................. | 702/68 |
| 4,130,792 A * | 12/1978 | Sullivan | ..................... | 324/327 |
| 4,547,678 A * | 10/1985 | Metzner et al. | ........... | 290/40 C |
| 4,933,614 A * | 6/1990 | Kawata | ...................... | 318/432 |
| 5,280,790 A * | 1/1994 | Brooks | ...................... | 600/494 |
| 5,410,282 A * | 4/1995 | Larrick et al. | ............... | 330/149 |
| 5,534,816 A * | 7/1996 | Koglin et al. | ................ | 327/513 |
| 5,742,403 A * | 4/1998 | Compton et al. | ........... | 358/406 |
| 6,111,783 A | 8/2000 | Tran et al. | .................... | 365/171 |
| 6,230,562 B1 * | 5/2001 | Ishikawa et al. | ......... | 73/504.02 |
| 6,256,224 B1 | 7/2001 | Perner et al. | ............... | 365/173 |
| 6,259,644 B1 | 7/2001 | Tran et al. | .................... | 365/209 |
| 6,262,625 B1 | 7/2001 | Perner et al. | .................. | 330/2 |
| 6,590,804 B1 * | 7/2003 | Perner | ....................... | 365/158 |
| 6,611,468 B1 * | 8/2003 | Nojiri et al. | ................. | 365/207 |
| 6,611,611 B1 * | 8/2003 | Oka et al. | .................... | 382/110 |
| 6,885,242 B1 * | 4/2005 | Leffel et al. | ................ | 330/149 |
| 2003/0189853 A1 * | 10/2003 | Tanizaki et al. | ............ | 365/200 |

* cited by examiner

Primary Examiner—M. Tran

(57) ABSTRACT

A method and apparatus are disclosed for adjusting the offset voltage of a circuit. In one embodiment, the method comprises: supplying reference and supply voltages to the circuit, controlling a voltage across a memory element to be approximately equal to the reference voltage, comparing the current through the memory element to a predetermined value, and adjusting an offset voltage of the circuit, where the offset may remain substantially constant despite changes in the supply voltage.

24 Claims, 5 Drawing Sheets

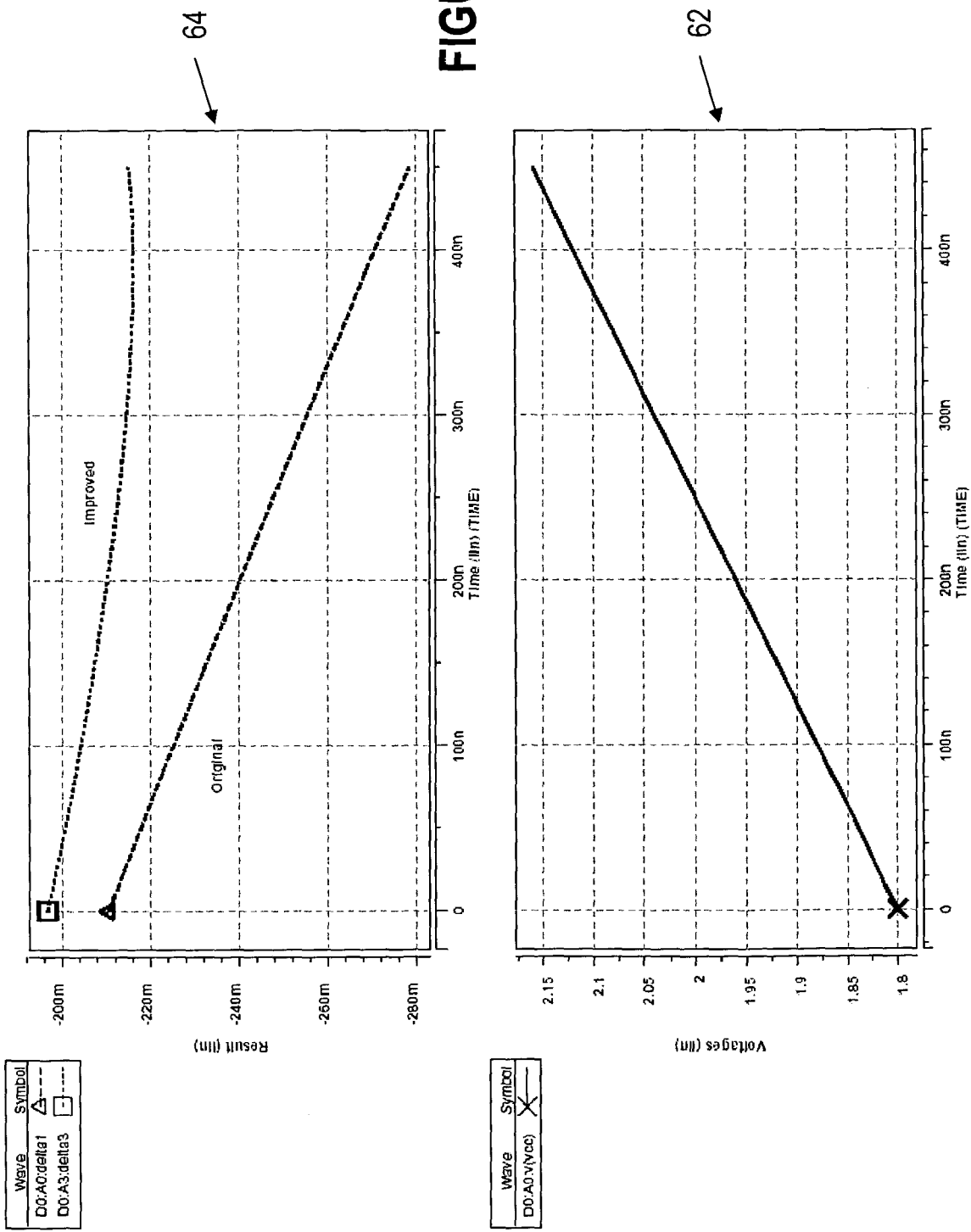

METHOD AND SYSTEM FOR ADJUSTING OFFSET VOLTAGE

BACKGROUND

In today's society, computers are ubiquitous. For example, computers may be found in grocery stores, automobiles, airplanes, and watches. Often computers include a processor that executes various functions such as mathematical computations, running programs, and retrieving and storing information. A processor that retrieves and stores information may use a storage device such as a disk drive (e.g., hard disk) or memory. Generally, memory devices store information in binary form—i.e., 1s and 0s. Binary information may be stored by assigning differing voltage states to binary values. For example, a binary 0 may be assigned 0 volts, while a binary 1 may be assigned 5 volts. Traditionally, memory devices have been implemented using transistors configured to form logic gates that are able to store binary values. However, recent trends include memory devices implemented using an array of magnetic elements that are constructed using semiconductor processing techniques.

One embodiment of an array of magnetic memory elements may comprise individual magnetic memory elements formed by using two layers of magnetic material that have adjustable magnetic orientations. The magnetic materials may be formed with an insulating layer sandwiched between them. Because the magnetic materials are designed to be adjustable, the magnetic field for each material may be adjusted by applying electrical current in proximity to them. The orientations of two magnetic layers may be in the same direction (termed "parallel"), or they may be opposite each other (termed "anti-parallel").

Each magnetic memory element may also have an electrical resistance. The electrical resistance of the magnetic memory element may vary depending on the parallel or anti-parallel orientation of its magnetic fields. For example, parallel orientation may yield a resistance of 1 MΩ whereas anti-parallel orientation may produce a resistance of 1.1 MΩ. Because the resistance of the magnetic memory element may be changed, binary values (e.g., 1s and 0s) may be associated with the electrical resistance.

To determine the resistive value of a memory element, which effectively determines the binary or digital value contained therein, a voltage is developed across the memory element. Using this voltage, or alternately a current derived from this voltage, the resistance value of the memory element may be estimated, and the digital value stored in the memory element may be determined.

For one or more reasons, estimations for the resistive value of an individual memory element within the memory array may be inaccurate, which may then cause the digital value to be inaccurately determined. One reason for the inaccuracies of the resistance estimation is that the memory elements within the array are coupled to each other. As a result, the resistance estimation for one memory element may be affected by the resistance of not only the desired memory element, but also the resistance associated with memory elements which are coupled to the desired memory element.

SUMMARY

A method and apparatus are disclosed for adjusting the offset voltage of a circuit. In one embodiment, the method comprises: supplying reference and supply voltages to the circuit, controlling a voltage across a memory element to be approximately equal to the reference voltage, comparing the current through the memory element to a predetermined value, and adjusting an offset voltage of the circuit, where the offset may remain substantially constant despite changes in the supply voltage.

BRIEF DESCRIPTION OF THE DRAWINGS

For a detailed description of the preferred embodiments of the invention, reference will now be made to the accompanying drawings in which:

FIG. 5 shows experimental results.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted or otherwise used as limiting the scope of the disclosure, including the claims. In addition, one skilled in the art will understand that the following description has broad application, and the discussion of any embodiment is meant only to be exemplary, and is not intended to intimate that the scope of the disclosure, including the claims, is limited to these embodiments.

Figure 1:
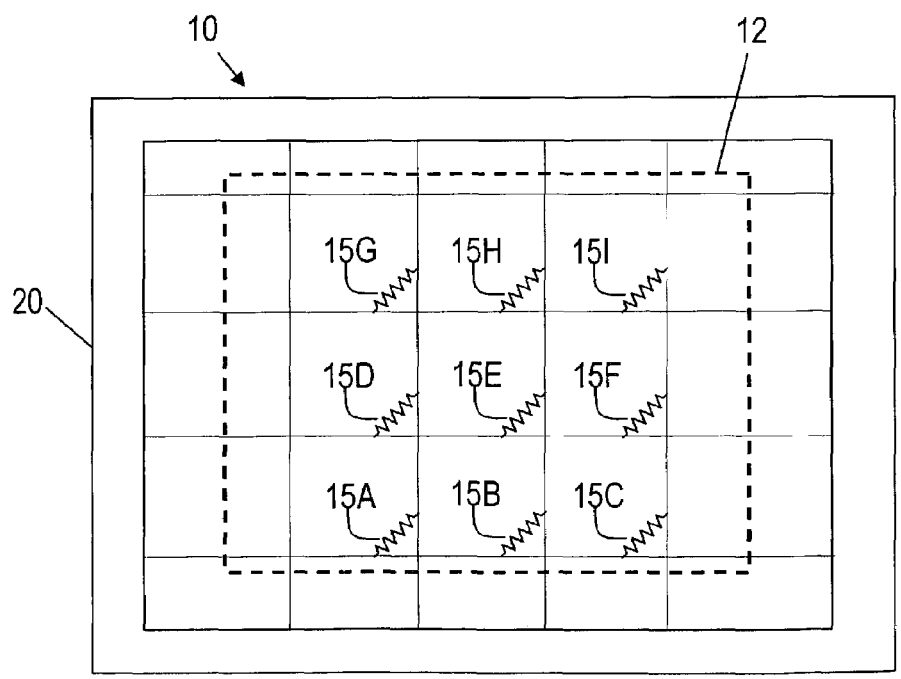
FIG. 1 shows a memory usable in accordance with various embodiments.

Referring to FIG. 1, a memory 10 including an array 12 of memory elements is shown. The array 12 includes memory elements 15A–I shown as resistors. However, the memory elements 15A–I may comprise other devices as would be familiar to one of ordinary skill in the art. For example, the memory elements 15A–I may include capacitors, inductors, a tunnel junction in series with a diode, or any other type or combination of integrated circuit element that facilitates the storage of data. Accompanying circuitry 20 serves to write data to the array 12 and also serves to read data from the array 12. Digital values may be written in memory 10 by setting the resistance of the memory elements 15A–I, where various resistive values may be assigned to various bit states. For example, memory element 15A may contain a resistance of 1 MΩ for a 1 bit value or 1.1 MΩ for a 0 bit value. Accordingly, there may be N distinct data values represented by each memory element for N distinct resistive states.

Figure 2B:
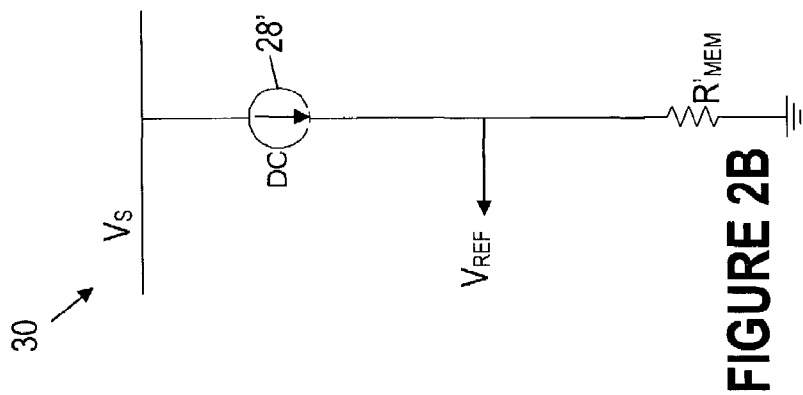
FIG. 2B shows a reference circuit that may be used in accordance with various embodiments.
Figure 2A:
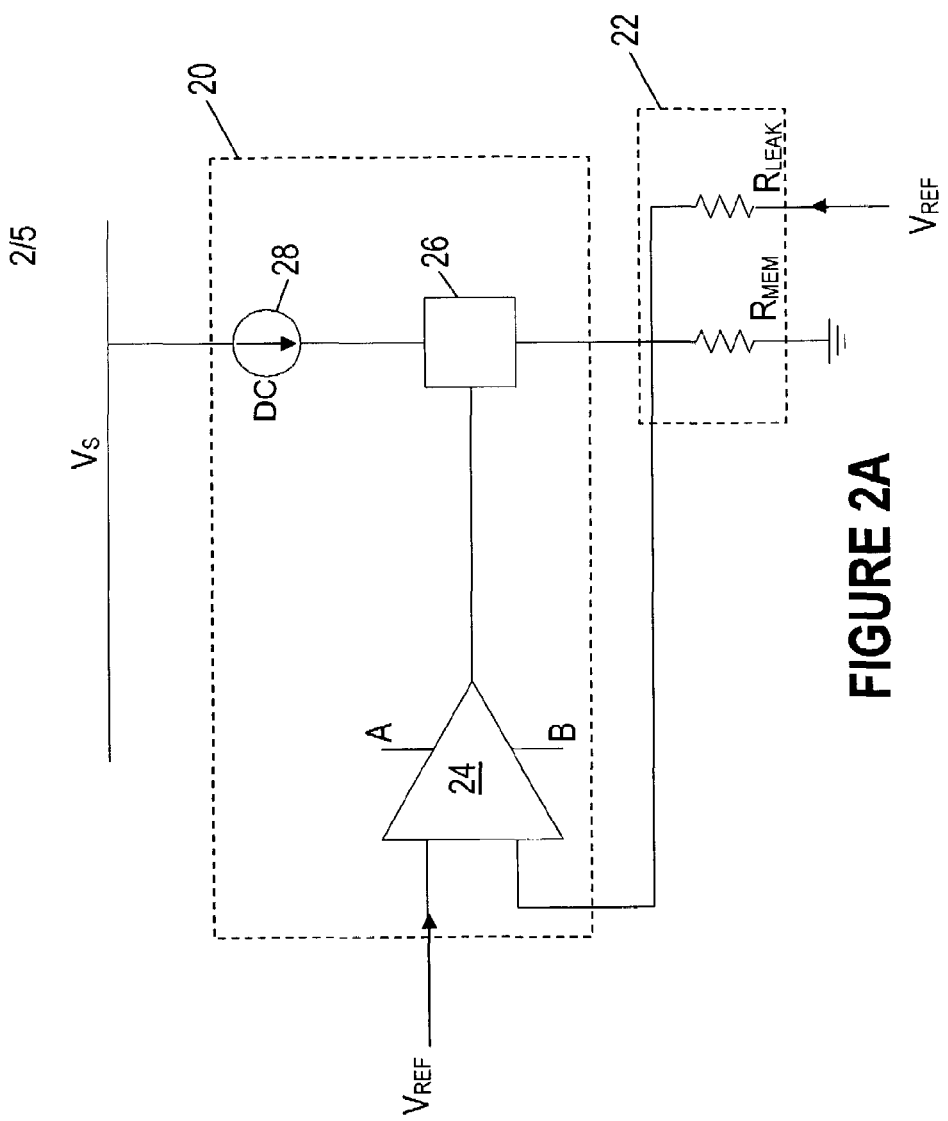
FIG. 2A shows a circuit in accordance with various embodiments.

FIG. 2A shows an exemplary implementation of circuitry 20 coupled to one or more memory elements 22. Memory elements 22 may include a desired memory element or a memory element that is to be measured, as well as other undesired memory elements, or memory elements that may impact the measurement of the desired memory element. The desired memory elements may be represented by resistance $R_{MEM}$, while undesired memory elements may be represented by resistance $R_{LEAK}$. The undesired memory elements represented by resistance $R_{LEAK}$ and may include any number of memory elements—e.g., memory elements that may be coupled to the desired memory element, yet may not be fully deselected. A gain stage 24 may have one input coupled to the memory elements 22, another input coupled to a voltage reference $V_{REF}$, and an output coupled to a controller 26, where the controller 26 forms a feedback loop. A current source 28 may also be coupled between a voltage supply $V_S$ and the controller 26. During operation, the controller 26 may moderate the current flowing from current source 28 so as to maintain $V_{REF}$ across the parallel combination of resistances $R_{MEM}$ and $R_{LEAK}$.

Gain stage 24 may also include adjustment terminals A and B so that the voltage that is required to "turn on" gain stage 24 may be adjusted if desired. Terminal A may adjust the turn on voltage for one input, while terminal B may adjust the turn on voltage for another input, where adjustments at terminals A and B may be made independently. The difference between the turn on voltage of the input terminals may be referred to as "input offset". In addition to allowing for the adjustment of the turn on voltage, terminals A and B may also allow for adjustment of the input offset voltage.

The resistance of the desired memory element $R_{MEM}$ may represent its digital value, and may be programmed so that various digital values may be represented by the desired memory element. For example, a 1 bit value in the desired memory element may be represented by a resistance of 1 MΩ, and a 0 bit value may be represented by a resistance of 1.1 MΩ. The feedback loop formed by gain stage 24 and controller 26 may control the voltage across memory elements 22—i.e., $R_{MEM}$ and $R_{LEAK}$—at the known reference voltage $V_{REF}$. With the voltage across $R_{MEM}$ maintained at the known reference voltage, the resistance $R_{MEM}$ may be estimated by measuring the current through $R_{MEM}$. Since current source 28 provides current for resistors $R_{MEM}$ and $R_{LEAK}$, the current source may be utilized to estimate $R_{MEM}$ or the digital value contained in the desired memory element.

As the memory element represented by $R_{MEM}$ is programmed, the resistance $R_{MEM}$ may change to represent the different digital states. When $R_{MEM}$ changes, the amount of current provided by current source 28 may change. Accordingly, the different levels of current provided by current source 28 may then reflect the different binary values that $R_{MEM}$ may assume. However, the amount of change in the current source 28 as a result of $R_{MEM}$ changing digital values may be unnoticeable compared to the current consumed by the undesired memory elements—i.e., $R_{LEAK}$. For example, $R_{LEAK}$ may comprise seven memory elements, which may be equal to $R_{MEM}$. In this case, the equivalent resistance $R_{LEAK}$ may be approximately $\frac{1}{7}^{th}$ the value of $R_{MEM}$. Thus, the propensity for $R_{LEAK}$ to carry current is significantly greater due to this lower resistance. Therefore small variations across $R_{LEAK}$ have a significant effect. Because the resistive changes in the value of $R_{MEM}$ corresponding to the changing digital states may represent only a fraction of the current change in $R_{MEM}$, it may be difficult to distinguish this change (and hence the digital value) in light of the current consumed by $R_{LEAK}$. Therefore by adjusting gain stage 24 using adjustment terminals A and/or B, imprecision introduced by the undesired memory elements may be accounted for.

FIG. 2B illustrates a reference circuit 30 that may be integrated on the same chip as circuitry 20 and memory elements 22. The reference circuit 30 includes a memory element $R'_{MEM}$ that may be built to match the desired memory element $R_{MEM}$ of memory elements 22. A current source 28' may also be coupled between the voltage supply $V_s$ and memory element $R'_{MEM}$. Also, the reference voltage $V_{REF}$ may be maintained across memory element $R'_{MEM}$. Because reference circuit 30 may be integrated on the same chip as circuitry 20 and memory elements 22, current source 28' may be used as a reference current source. If circuitry 20 and circuitry 30 have common supply and reference voltages, and $R'_{MEM}$ matches $R_{MEM}$, then the current in current source 28' may represent the amount of current in $R_{MEM}$. Also, the current through current source 28 may represent the amount of current in the combination of $R_{MEM}$ and $R_{LEAK}$. Thus, the difference in current between current source 28' and current source 28 may represent the amount of imprecision introduced by the $R_{LEAK}$.

Figure 3:
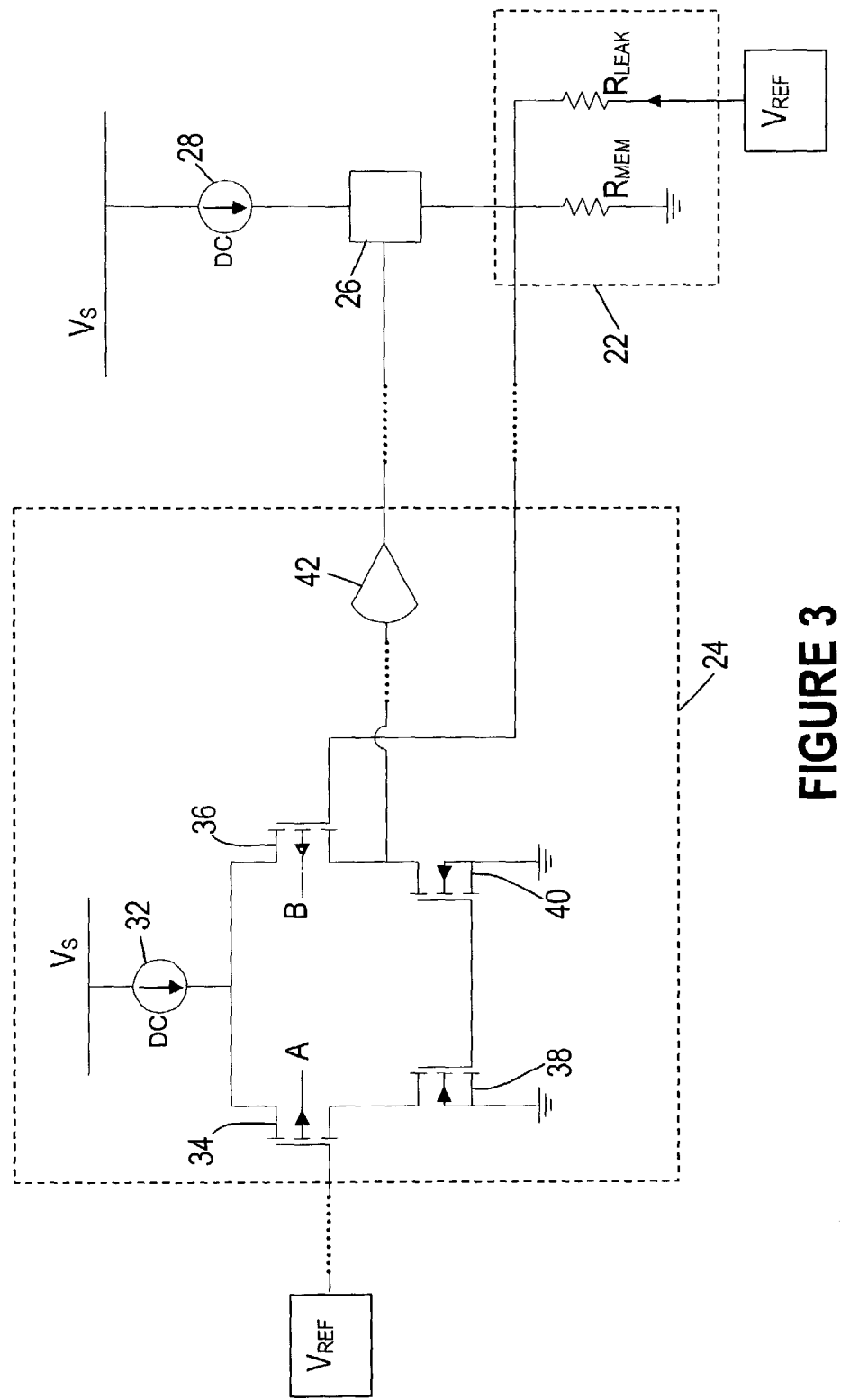
FIG. 3 shows gain stage circuitry in accordance with various embodiments.

FIG. 3 shows one embodiment of gain stage 24 utilizing metal-oxide-semiconductor-transistors (MOSFETs). Note, however, various gain stages may exist that utilize differing technology, such as bipolar transistors and other field effect transistors. To this end, it may be more advantageous in some situations to construct the circuits disclosed herein using transistor technologies that are different than what is shown (e.g., using junction-field-effect-transistors, or depletion-mode MOSFETs). Accordingly, the claims should be interpreted to include all such variations.

Referring to FIG. 3, a current source 32 may be coupled to a voltage supply $V_S$ and provide current to the source connections of transistors 34 and 36, which form a differential input pair. Although shown as an ideal current source, current source 32 may be implemented in a variety of ways including using active components (e.g., transistors) or passive components (e.g., resistors). The gate connections of transistors 34 and 36 may serve as input terminals to gain stage 24. As such, transistor 34 may be coupled to reference voltage $V_{REF}$, and transistor 36 may be coupled to the memory elements 22. Transistors 38 and 40 may have their drain connections coupled to the drain connections of transistors 34 and 36 respectively. Consequently, transistors 38 and 40 may form an active load with their gate connections coupled together. In this configuration, their source connections are to coupled ground, and their gate connections are coupled to the drain of transistor 34. Current source 32 as well as transistors 34, 36, 38, and 40 may comprise a first gain stage. The connections of gain stage 24 may be indirect as shown by the dotted lines. As such, gain stage 24 may include subsequent gain stages (e.g., secondary gain stage 42) that couple the output of previous gain stages to the controller 26.

Additionally, transistors 34 and 36 may include body connections, represented by the adjustment terminals A and B. A voltage potential between the source connections and the body connections of a transistor may modify the transistor's operation, including modifying the threshold voltage $V_T$ in a field-effect-transistor (FET). The threshold voltage $V_T$, in general, may represent the amount of voltage required to establish the normal conducting operation for the transistor—i.e., to turn the transistor on. Therefore, by adjusting the voltage at terminals A or B, the turn on voltage of the input terminals of gain stage 24—as well as the input offset—may be adjusted.

In some embodiments, it may be desirable to compensate for the imprecision introduced by the undesired memory elements. One method of compensating for imprecision introduced by the undesired memory elements is to adjust the turn on voltage and/or input offset of gain stage 24. In general, a voltage source may be present at terminals A and B of gain stage 24 to compensate the input offset variations induced by supply voltage changes. This voltage source may maintain a predetermined voltage drop between terminals A and B of gain stage 24 and the supply voltage $V_S$, where the predetermined voltage drop tracks changes in supply voltage $V_S$. By maintaining a predetermined voltage drop from $V_S$ to terminals A and B, the overall sensitivity to changes in supply voltage may be reduced.

Figure 4A:
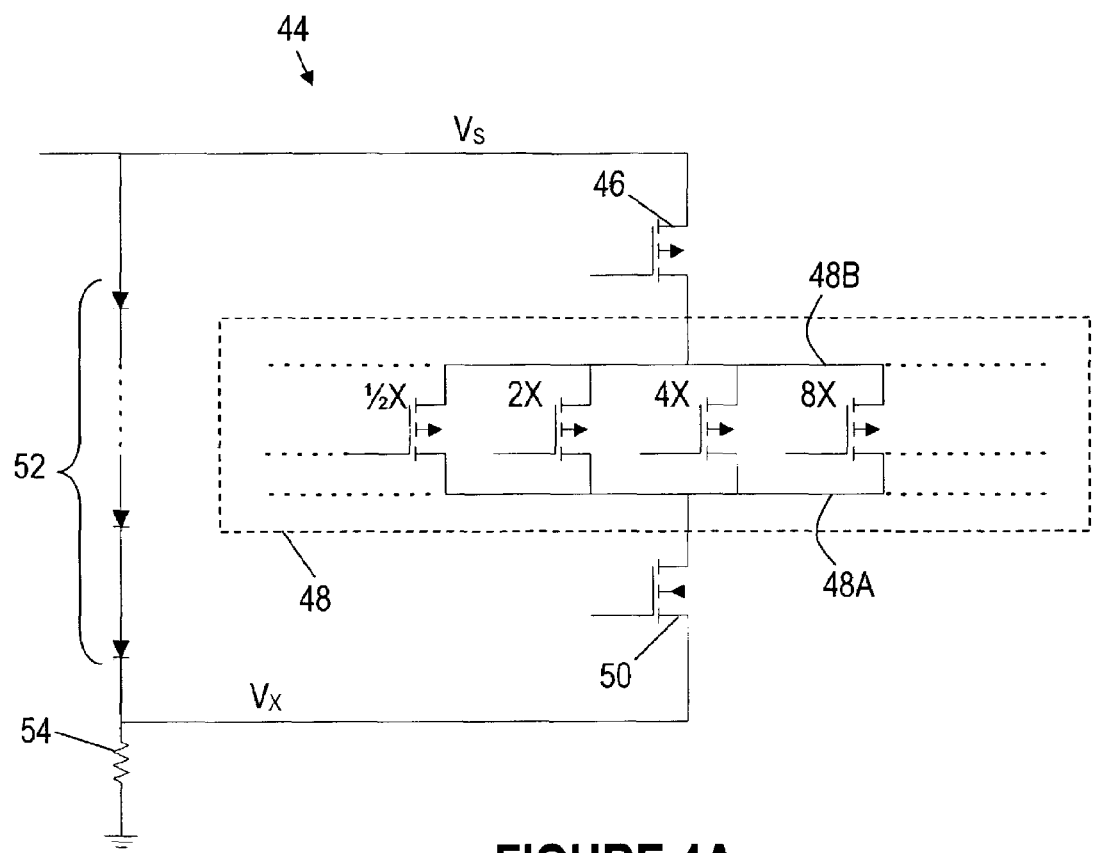
FIG. 4A shows a circuit that may be used to provide an adjustment voltage in accordance with various embodiments.

FIG. 4A shows one possible circuit 44, which may be used to compensate for imprecision by adjusting the voltage present at terminals A and B of gain stage 24. Circuit 44 may include transistor 46, with its source connected to a voltage supply $V_S$ and its drain connected to a plurality of adjustment transistors 48. By modulating the voltage on the gate of transistor 46, circuit 44 may be enabled and disabled. Likewise a transistor 50 may have its drain coupled to the plurality of adjustment transistors 48, its source coupled to a predetermined voltage $V_X$ (which scales with the supply voltage $V_S$), while the voltage on its gate may be modulated to enable and disable the circuit 44. Because the predetermined voltage $V_X$ scales with $V_S$, the voltage across the combination of the plurality of transistors 48 and transistors 46 and 50 may be considered approximately invariant to changes in the supply voltage $V_S$.

The plurality of transistors 48 may comprise transistors that may be connected in parallel, with their drains coupled together and coupled to the source of transistor 46, and with their sources coupled together and coupled to the drain of transistor 50. The gates of individual transistors within the plurality of transistors 48 may be independently modulated to turn the individual transistors on and/or off contemporaneously. For example, a programmable register (not shown) may be connected to the gates of the plurality of transistors 48. In this connection, as the register is incremented, an optimum configuration may be determined where a number of transistors within the plurality 48 may be turned on and a number of transistors within the plurality 48 may be turned off. The programmable register may be implemented using a counter that proceeds through the possible configurations.

The plurality of transistors 48 may be coupled to the adjustment terminals of gain stage 24—either by coupling the common drain connection 48A to the adjustment terminals of gain stage 24 or by coupling the common source connection 48B to the adjustment terminals of gain stage 24. In this manner, the voltage across the combination of transistors 46, 48, and 50 may be approximately constant, yet the voltage provided to the adjustment terminals of gain stage 24, from either connection 48A or 48B, may be adjusted independent of changes in supply voltage $V_S$.

Adjustment terminal A of gain stage 24 may have one compensation circuit 44 attached to it, while adjustment terminal B of gain stage 24 may also have another compensation circuit 44 attached to it. Consequently, each adjustment terminal of gain stage 24 may have a separate compensation circuit 44 coupled to it. Because each adjustment terminal maintains voltage despite $V_S$ variations, the offset voltage of gain stage 24 may be maintained despite changes in supply voltage $V_S$.

Individual transistors within the plurality of transistors 48 may be proportional in size and/or strength such that individual transistors may have a different impact on the amount of voltage across the plurality of transistors 48. For example, the individual transistors may be proportional to each other in a binary manner (termed "binary weighted"), as shown. In this manner, there may be a reference transistor X, and other transistors within the plurality of transistors 48 may be ½X, 2X, 4X, 8X. Thus, turning the binary weighted transistors on according to various combinations may yield numerous adjustment voltages for gain stage 24. The precision of the voltage generated by circuit 44 may be modified by including additional binary weighted transistors in the plurality of transistors 48.

The predetermined voltage $V_X$ (which scales with voltage supply $V_S$ fluctuations) may be generated using a plurality of diodes 52 and a resistive element 54 coupled to ground. The precise number of diodes may be chosen such that the voltage difference between the supply voltage $V_S$ and the predetermined voltage $V_X$ may be set. For example, if the plurality of diodes 52 comprises N number of diodes having similar forward bias voltages $V_F$, then the difference between the supply voltage $V_S$ and $V_X$ may be approximately $N*V_F$. Resistive element 54 may be used to sustain forward bias operation of the plurality of diodes 52 by providing a current path for the current flowing through the plurality of diodes 52. Thus, as the supply voltage $V_S$ fluctuates, the voltage $V_X$ may follow the fluctuation (e.g., $N*V_F$ volts below $V_S$) and the current through resistive element 54 may increase or decrease accordingly. The plurality of diodes 52 shown may be transistors that have been diode connected.

Figure 4B:
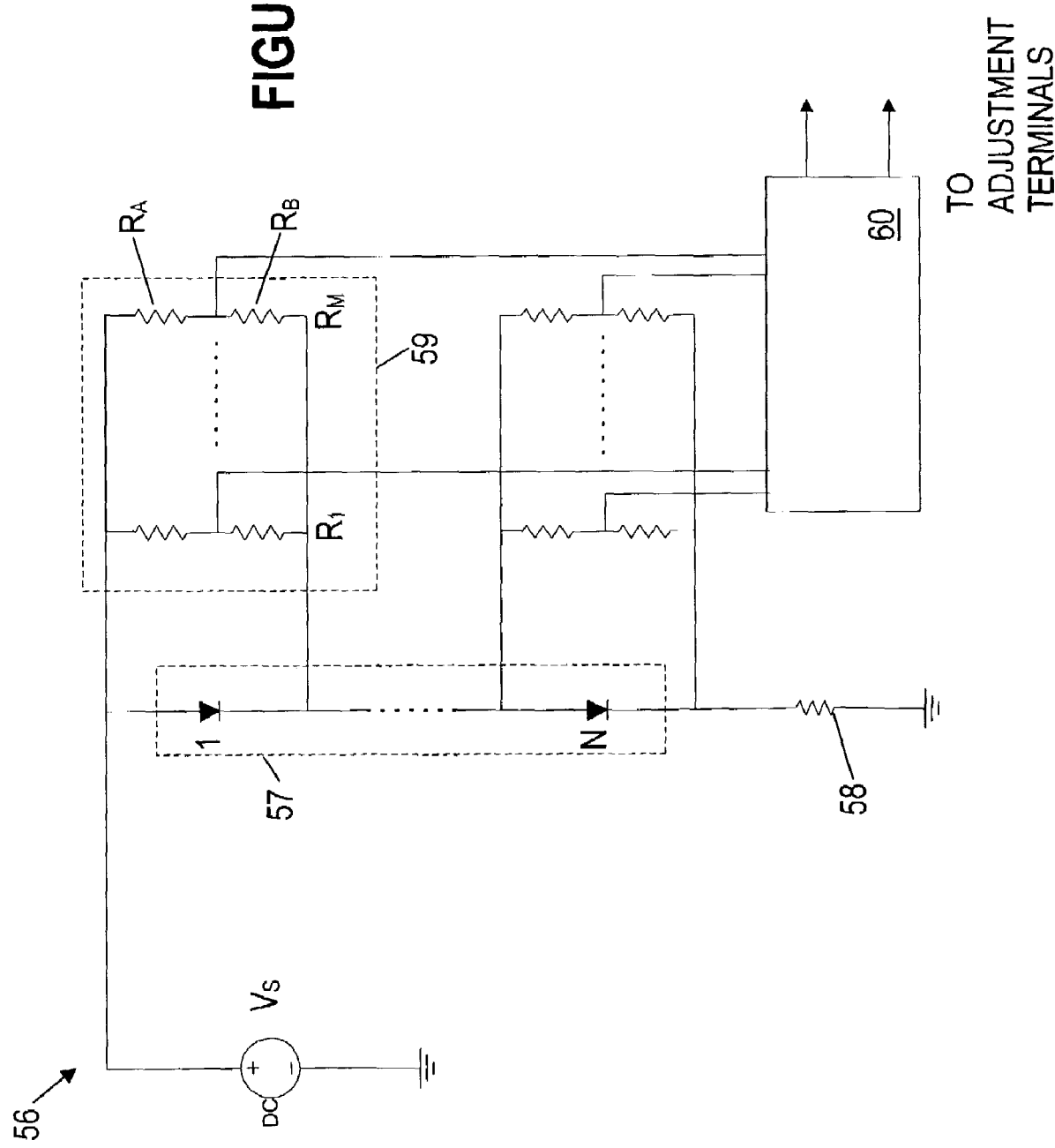
FIG. 4B shows a circuit that may be used to provide an adjustment voltage in accordance with various embodiments.

FIG. 4B shows another possible circuit 56 that may be used to compensate for imprecision by adjusting the voltage present at terminals A and B of gain stage 24. Circuit 56 may include a plurality of diodes 57 (e.g., $D_1$ through $D_N$) that may be connected serially between the supply voltage $V_S$ and a resistor 58. The plurality of diodes may comprise transistors that may be diode connected. Each diode may have a plurality of resistors 59 (e.g., $R_1$ through $R_M$) coupled to the diode in parallel fashion as shown. There may be a plurality of resistors 59 for each diode in the plurality of diodes 57, or alternately there may be a single plurality of resistors 59, which may be dynamically coupled to the diodes within the plurality of diodes as needed. Each resistor within the plurality of resistors 59 may further comprise multiple resistors $R_A$ and $R_B$ connected in series as shown.

Resistors $R_A$ and $R_B$ may be configured in a voltage divider arrangement so as to divide the voltage across the diode. The divided voltage may be binary weighted by adjusting the ratio between $R_A$ and $R_B$ for each resistor $R_1$ through $R_M$. Thus, using a selector 60 to choose a diode (of the N possible diodes) within the plurality of diodes 57 and a resistance (of the M possible resistances) within the plurality of resistances 59, N*M possible voltage values may be provided to adjustment terminals A and/or B of gain stage 24. The selector 60 may include a programmable register that selects one of the N*M voltages to be coupled to gain stage 24 during a memory calibration phase.

The voltages that may be provided to gain stage 24 by circuit 56 advantageously scale with the supply voltage $V_S$ so that the source-body voltages of transistors 34 and 36 may be approximately constant with fluctuations in supply voltage $V_S$. Accordingly, by adjusting the voltage at the adjustment terminals of gain stage 24, larger memory arrays may be achieved because the contribution of undesired memory elements—which increases as the size of the memory array increases—may be nullified regardless of supply variations.

The circuit embodiments shown in FIGS. 3A and 3B may be employed on the same chip. Supply and reference voltages (shown as $V_S$ and $V_{REF}$ respectively in FIGS. 3A and 3B) may be supplied to the chip. Gain stage 24 may then attempt to regulate the voltage across memory elements 22 to be approximately equal to the reference voltage $V_{REF}$. With the voltage across memory elements 22 approximately equal to $V_{REF}$, the current through current source 28 represents the current through $R_{MEM}$ and $R_{LEAK}$. Additionally, $V_{REF}$ may be regulated across $R'_{MEM}$ (as shown in FIG. 2B) so that the current through current source 28' represents a predetermined value. By comparing the current through current source 28' to the current through current source 28, an estimation of the offset adjustment to terminals A and B of gain stage 24 may be made.

FIG. 5 shows possible improvements in performance by utilizing the preferred embodiments. Graph 62 depicts varying a supply voltage $V_S$ (having a nominal value of 2 volts) by +/−10%. Graph 64 depicts the resulting input offset voltage that may be induced as a result of a varying the supply voltage. The two curves shown in graph 64 represent the input offset voltage of gain stage 24 that results from varying the supply voltage $V_S$, both with and without adjustment circuitry 44 coupled to each adjustment terminal A and B. Variations in input offset voltage resulting from variations in supply voltage $V_S$ may be reduced by implementing adjustment circuitry.

While the embodiments disclosed herein (and their equivalents) may be employed in a memory, this memory may be further employed in any electronic device. More particularly this memory may be included in a computer comprising a processor that may be coupled to the memory.

The above discussion is meant to be illustrative of the principles and various embodiments of the present invention. Numerous variations and modifications will become apparent to those skilled in the art once the above disclosure is fully appreciated. Accordingly, aspects of the embodiments may be combined together in various forms to achieve desirable results. It is intended that the following claims be interpreted to embrace all such variations and modifications.

What is claimed is:

1. A method, comprising:
   (a) supplying a supply voltage and a reference voltage to a circuit;
   (b) controlling a voltage across at least one memory element to be approximately equal to the reference voltage;
   (c) comparing current through said at least one memory element to a predetermined value; and
   (d) adjusting an offset voltage of the circuit, wherein the offset remains substantially constant despite changes in the supply voltage.

2. The method according to claim 1, wherein the predetermined value comes from a circuit that determines the amount of current in a reference memory element.

3. The method according to claim 1, wherein adjusting the offset voltage comprises coupling an adjustment voltage to a body connection of a transistor within the circuit, wherein the adjustment voltage tracks changes in supply voltage.

4. The method according to claim 1, wherein adjusting the offset voltage comprises coupling an adjustment voltage to a body connection of a transistor within the circuit, wherein the adjustment voltage is produced by:
   providing a first voltage to a plurality of transistors;
   providing a second voltage to the plurality of transistors, wherein the second voltage follows changes in the first voltage; and
   modifying the conductive state of at least one transistor within the plurality of transistors, wherein the modification causes an internal voltage within the plurality of transistors to change, wherein the internal voltage is used as the adjustment voltage.

5. The method according to claim 4, wherein the plurality of transistors are proportional to a reference transistor in a binary weighted fashion.

6. The method according to claim 1, wherein adjusting the offset voltage comprises selecting from among a plurality of voltages generated by dividing a voltage across a diode using a plurality of resistances.

7. A method, comprising:
   providing a first voltage to a plurality of transistors;
   providing a second voltage to the plurality of transistors, wherein the second voltage follows changes in the first voltage;
   modifying the conductive state of at least one transistor within the plurality of transistors, wherein the modification causes an internal voltage within the plurality of transistors to change; and
   providing the internal voltage to an adjustment terminal of a gain stage.

8. The method according to claim 7, wherein the adjustment terminal further comprises a body connection of a transistor.

9. The method according to claim 7, wherein the size of the plurality of transistors are scaled in a binary fashion.

10. A circuit, comprising:
    a plurality of memory elements; and
    a gain stage coupled to said memory elements and a supply voltage;
    wherein said gain stage comprises at least one terminal coupled to an adjustment voltage that is approximately constant with changes in supply voltage;
    wherein said adjustment voltage is provided by a selector that is coupled to a plurality of voltages and selects said adjustment voltage from among the plurality of voltages.

11. The circuit of claim 10, wherein said plurality of voltages are generated using a plurality of resistive elements coupled to at least one diode such that said resistive elements provide a voltage proportional to the voltage across the diode.

12. The circuit of claim 11, wherein said plurality of resistive elements are proportional to each other in a binary weighted fashion.

13. A circuit, comprising:
    a plurality of memory elements; and
    a gain stage coupled to said memory elements and a supply voltage;
    wherein said gain stage comprises at least one terminal coupled to an adjustment voltage that is approximately constant with changes in supply voltage;
    wherein said terminal of the gain stage represents a body connection of a transistor.

14. A circuit, comprising:
a plurality of memory elements; and
a gain stage coupled to said memory elements and a supply voltage;
wherein said gain stage comprises at least one terminal coupled to an adjustment voltage that is approximately constant with changes in supply voltage
wherein said terminal of the gain stage represents a body connection of a transistor;
wherein said memory elements comprise magnetic memory elements.

15. The circuit of claim 14, wherein said memory elements comprise desired and undesired memory elements and said adjustment voltage is varied to compensate for current consumed by undesired memory elements.

16. A circuit, comprising:
a plurality of transistors connected in parallel, wherein a first terminal of the transistors is coupled to a supply voltage and a second terminal of the transistors is coupled to a reference voltage that tracks said supply voltage; and
a gain stage coupled to a plurality of memory elements and to said supply voltage;
wherein said gain stage comprises at least one terminal coupled to an adjustment voltage that tracks changes in said supply voltage.

17. The circuit of claim 16, wherein said adjustment voltage is provided by said plurality of transistors connected in parallel.

18. The circuit of claim 17, wherein said adjustment voltage is varied by altering the conductive state of said plurality of transistors.

19. The circuit of claim 18, wherein said plurality of transistors are proportional to each other in a binary weighted fashion.

20. The circuit of claim 16, wherein said terminal of the gain stage represents a body connection of a transistor.

21. The circuit of claim 20, wherein said memory elements comprise magnetic memory elements.

22. The circuit of claim 21, wherein said memory elements comprise desired and undesired memory elements and said adjustment voltage is varied to compensate for current consumed by undesired memory elements.

23. A circuit, comprising:
a plurality of magnetic memory elements;
a gain stage coupled to said magnetic memory elements and a supply voltage; and
means for adjusting an offset voltage of the gain stage, wherein the offset voltage remains substantially constant despite changes in a supply voltage.

24. A circuit, comprising:
a plurality of memory elements;
a gain stage coupled to said memory elements and a supply voltage; and
means for adjusting an offset voltage of the gain stage;
wherein said means of adjusting the offset voltage comprises a plurality of resistive elements to at least one diode such that said resistive elements provide a voltage proportional to the voltage across the diode.

* * * * *